United States Patent [19]

Robinson

[11] Patent Number: 4,458,197

[45] Date of Patent: Jul. 3, 1984

[54] APPARATUS AND METHOD FOR AUTOMATICALLY TESTING A MULTIPLE NODE ELECTRICAL CIRCUIT

[75] Inventor: C. Sylvester Robinson, Federal Way, Wash.

[73] Assignee: The Boeing Company, Seattle, Wash.

[21] Appl. No.: 299,920

[22] Filed: Sep. 8, 1981

[51] Int. Cl.³ .................. G01R 15/12; G01R 31/02
[52] U.S. Cl. .................................................. 324/73 AT
[58] Field of Search ............ 324/73 AT, 73 PC, 73 R

[56] References Cited

U.S. PATENT DOCUMENTS

| | | | |
|---|---|---|---|
| 4,196,386 | 4/1980 | Phelps | 324/73 PC |
| 4,290,013 | 9/1981 | Thiel | 324/73 PC |
| 4,342,959 | 8/1982 | Skilling | 324/73 PC |

Primary Examiner—Gerard R. Strecker
Assistant Examiner—Warren S. Edmonds
Attorney, Agent, or Firm—Christensen, O'Connor, Johnson & Kindness

[57] ABSTRACT

Each of a plurality of circuit node voltages is sampled at high speed with quadrature mode samples being stored at every quarter wavelength of a reference waveform and spurt mode samples stored over a quarter wave of a reference waveform. The stored signals are processed to determine whether the sampled waveform is DC, AC, AC on DC, digital or noise and whether it is within a tolerance value. If the sampled signal is outside of tolerance the circuit node is slow sampled and compared to a reference tolerance. If an out-of-tolerance condition still persists, the testing apparatus makes an internal check of its circuitry. A failure at the node is indicated if the internal check determines that the testing apparatus is operating properly.

16 Claims, 12 Drawing Figures

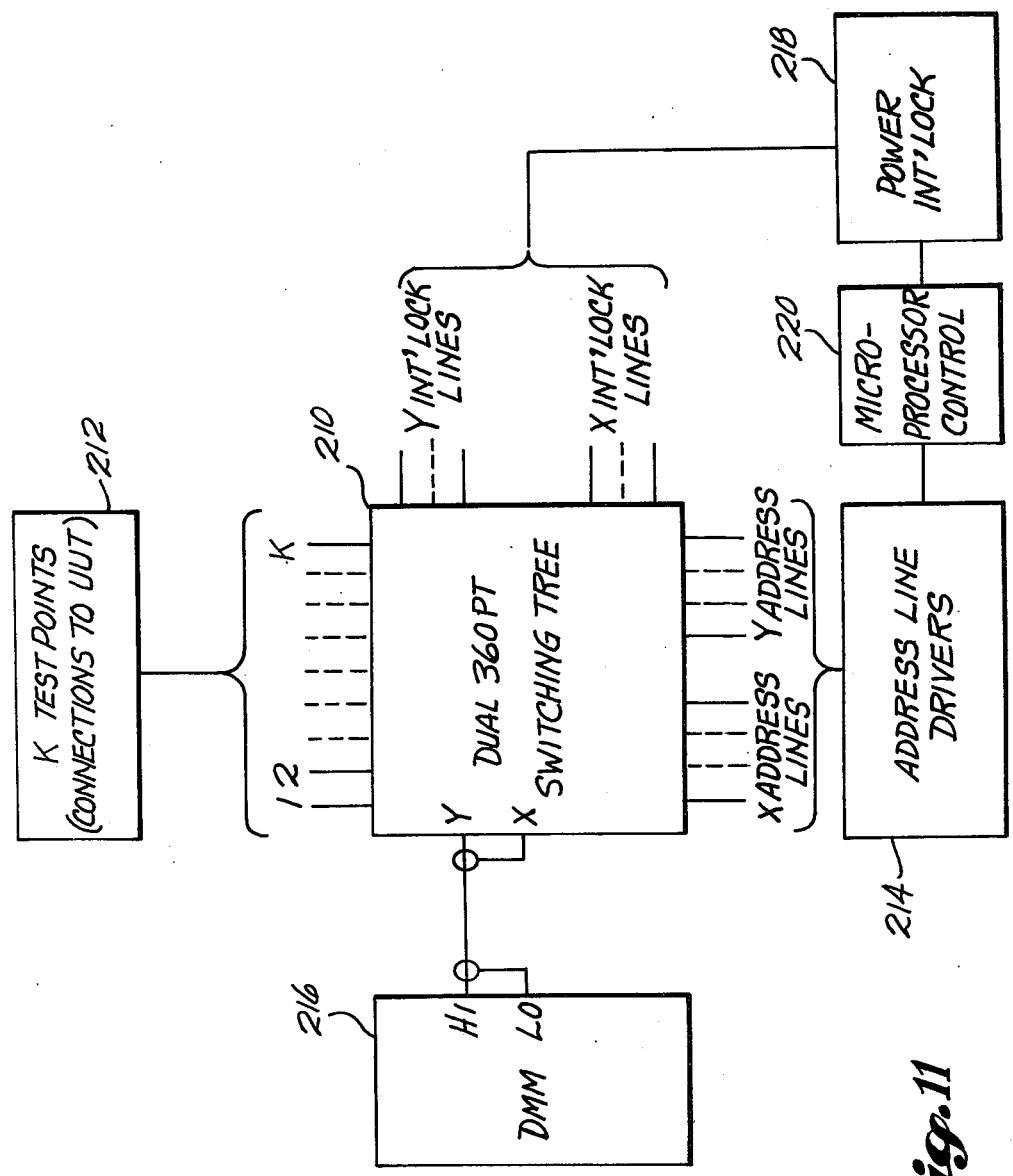

APPARATUS AND METHOD FOR AUTOMATICALLY TESTING A MULTIPLE NODE ELECTRICAL CIRCUIT

BACKGROUND OF THE INVENTION

The present invention pertains to the electrical circuit testing art and, more particularly, to a method and apparatus for automatically testing each node of a multi-node circuit.

With the development of complex electronic circuitry, a need has arisen for automatic testing apparatus which is capable of circuit fault locating in a reliable manner. One application for such testing equipment is in the commercial aircraft art wherein, for example, a single aircraft may employ three inertial navigation systems (INS). Each such system is extremely complex and costly. It is important, therefore, that the aircraft circuitry to which the INS system connects be properly wired. The checkout of the INS aircraft wiring has heretofore involved service by a technician who, using manual probes and a meter, takes measurements across various pin locations. Since there can be as many as 360 pins connecting to the INS, such testing has been time-consuming and laborious. In addition, the possibility has existed of the technician inadvertently shorting contacts during testing with resultant circuit damage.

Numerous automatic testing systems have been known in the prior art. Modern circuit testers employ small computers which, via suitable programming, cause selected circuit-under-test points to be connected to a multimeter. The meter, then, gives an indication of the particular electrical characteristic which is being checked.

The automatic circuit testing systems known to the prior art have several limitations which render them unsuited for certain types of testing, such as of the INS airplane wiring system discussed above. For example, such prior art systems, even though they are under computer control, are capable of a limited scope of testing, e.g. may check only for continuity. These prior systems are incapable of performing comprehensive testing of complex circuits, wherein each test point may have on it either DC, AC, AC on DC, digital or noise signals and, further, wherein circuit point-to-point measurements are desired. In addition, prior art circuit testing systems often caused test points on the circuit under test to be shorted together. This is particularly undesirable in the testing of circuits such as of the INS type, since a high voltage appearing at one pin might result in substantial equipment damage if shorted to other circuit pins.

SUMMARY OF THE INVENTION

It is an object of this invention, therefore, to provide an automatic testing system which is capable of high speed, yet reliable, testing of multi-node electrical circuits.

It is a further object of the invention to provide the above-described automatic testing system which is capable of testing for numerous types of signals appearing on any circuit node.

A further object of the invention is to provide the above-described testing system with features which minimize the possibility of the testing system damaging the unit under test.

Briefly, according to the invention, apparatus for automatically testing an electrical circuit having a plurality of test nodes comprises a metering means for measuring the electrical characteristics of circuits nodes connected thereto. The metering means is operable in a fast mode for taking high-speed samples of a signal on a circuit node connected thereto and being operable in a slow mode for measuring the analog value of a signal on a circuit node connected thereto. Also provided is switching means which is actuable to connect selected circuit test nodes to the metering means. A control means couples to the metering means and the switching means and is operable for:

(a) actuating the switching means such that a selected circuit test node is connected to the metering means;

(b) operating the metering means in the fast made for taking high speed samples of the signal at the connected node;

(c) predeterminedly processing the high speed samples;

(d) comparing the processed high speed samples with a predetermined first tolerance value;

(e) operating the metering means in the slow mode for meansuring the analog value of the signal at the connected node in response to the processed high speed samples being outside of the first tolerance value;

(f) comparing the slow speed meansured analog value with a predetermined second tolerance value; and (g) indicating a fault condition in response to the slow speed measured analog value being outside of the second tolerance value.

A method for automatically testing an electrical circuit having a plurality of test nodes comprises steps including providing a metering means for measuring the electrical characteristics of circuit nodes connected thereto. The metering means is operable in a fast mode for taking high speed samples of a signal on a circuit node connected thereto and is operable in a slow mode for measuring the analog value of a signal on a circuit node connected thereto. A switching means is provided which selectively connects predetermined test nodes to the metering means. A provided control means couples to the metering means and the switching means and performs the steps of:

(a) actuating the switching means such that a selected circuit test node is connected to the metering means;

(b) operating the metering means in the fast mode for taking high speed samples of the signal at the connected node;

(c) predeterminedly processing the high speed samples;

(d) comparing the processed high speed samples with a predetermined first tolerance value;

(e) operating the metering means in the slow mode for measuring the analog value of the signal at the connected node in response to the processed high speed samples being outside of the first tolerance value;

(f) comparing the slow speed measured analog value with a predetermined second tolerance value; and (g) indicating a fault condition in response to the slow speed measured analog value being outside of the second tolerance value.

BRIEF DESCRIPTION OF THE DRAWING

FIG. 11 is a block diagram illustrating the control of binary switching relay trees.

DETAILED DESCRIPTION OF THE PREFERRED EMBODIMENT OF THE INVENTION

Figure 1:
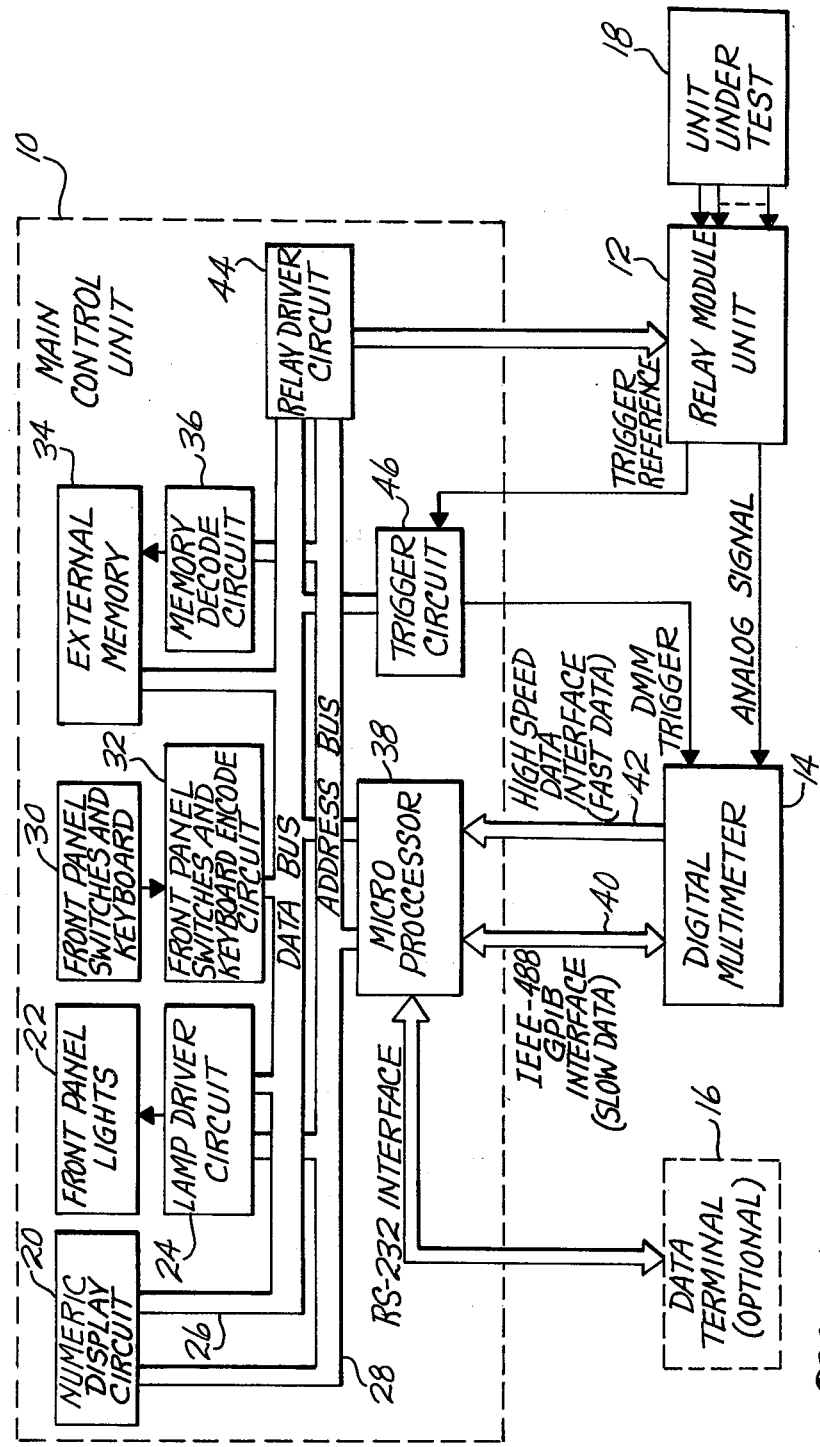
FIG. 1 is an overall block diagram of the automatic testing system.

FIG. 1 is a block diagram illustrating the major components of the automatic test equipment. These include a main control unit 10, a relay module unit 12, a digital multimeter 14, and a data terminal 16 (which is optional), all of which are used to check the unit under test 18.

In this, the preferred embodiment of the invention, the unit under test is that portion of an aircraft which connects to the Inertial Navigation System (INS). The main control unit 10, relay module 12 and multimeter 14 operate to monitor the voltage, whether DC, AC, AC on DC, or digital and compare the measured result with stored tolerance values for each of 360 test nodes contained within the unit under test 18. In addition, if the system senses the presence of low voltages present, it measures pin to pin resistance values between all such test nodes, again comparing the result to a stored reference value.

The main control unit 10 includes a numeric display circuit 20. The numeric display 20 is located on the front panel of the main control unit and is used to display voltage and resistance measurement values, parameter values, operator prompts and error codes.

The main components of the numeric display circuit 20 are numeric indicators which are appropriately connected to the remaining main control unit circuitry to thereby monitor and display the desired parameters.

Front panel lights 22 are used to indicate the present state of the testing system, indicate error conditions encountered and prompt the operator as to the next logical front panel switch to push for proper test sequencing.

A front panel light driver circuit 24 provides microprocessor control of the front panel lights. Thus, suitable circuitry within the lamp driver circuit 24 monitors microprocessor information on the data bus 26 and address bus 28 to thereby light appropriate front panel lights 22.

Front panel switches and keyboard 30 function to interface between the operator and the testing system to allow the operator control over testing functions, measurement operations and test data entry.

A switching encoding circuit 32 generates a discrete 8-bit binary number for each front panel switch and also generates an interrupt to the microprocessor when a front panel switch is activated.

External memory 34 which is more thoroughly discussed hereinbelow, has sixteen address lines and, therefore, is capable of addressing 65,536 memory locations. While certain read only memory (ROM) and random access memory (RAM) are provided with the microprocessor itself, the external memory 34 is provided, in the form of erasable programmable read only memory (EPROM), which is used to store program and test parameter data. Also, 4K of battery backup CMOS RAM is provided.

A memory decode circuit 36 selectively enables the EPROM and CMOS RAM memory chips on the external memory 34 as the microprocessor addresses the memory space in which the external memory lies. The memory decode circuit 36 also provides buffer/drivers for the address lines and data lines.

The microprocessor 38 provides the functions of command, control and computing. In this, the preferred embodiment of the invention, the microprocessor 38 is comprised of a Mostek SBD-80 microcomputer board. Besides producing addresses on the address bus 28 and responding to or producing data on the data bus 26, microprocessor 38 receives information from and provides data to the digital multimeter 14 over a standard IEEE-488 interface line 40. High speed data from the multimeter 14 is routed over a digital data line 42. In addition, the microprocessor includes an industry standard RS-232/20 mA current loop interface for serial communication with one or more data terminals, such as terminal 16.

A relay driver circuit 44 facilitates microprocessor control of the relays in the relay module 12. The relay driver circuit 44 includes a binary to Grey code conversion circuit which is used to convert the binary relay data from the microprocessor data bus to a mutated Grey code which is latched into the relay data output ports. The binary to Grey code conversion provides a means whereby in the normal sequence of test point scanning only one relay at a time changes state, thereby eliminating race conditions and reducing switching time. The relay driver circuit 44 includes output ports dedicated to select specific relays and output ports dedicated to providing power to either of two sets of relays, as is discussed hereafter.

For the purpose of conciseness, a detailed circuit diagram is not shown for any of the aforedescribed components of the main control unit 10. One of ordinary skill in this art, with the present specification in hand could easily implement such a system. For the purpose of reference, detailed information concerning microprocessor 38 is available in Mostek Publication No. MK 78544-SDB-80 Software Development Board.

A trigger circuit 46 connects to the data bus 26, relay module 12 and digital multimeter 14. It functions to generate a sequence of trigger pulses used to trigger the sample/hold analog to digital circuit of the digital multimeter. These triggers must be locked to an AC reference signal supplied to the trigger circuit from the relay module unit 12.

Figure 2:
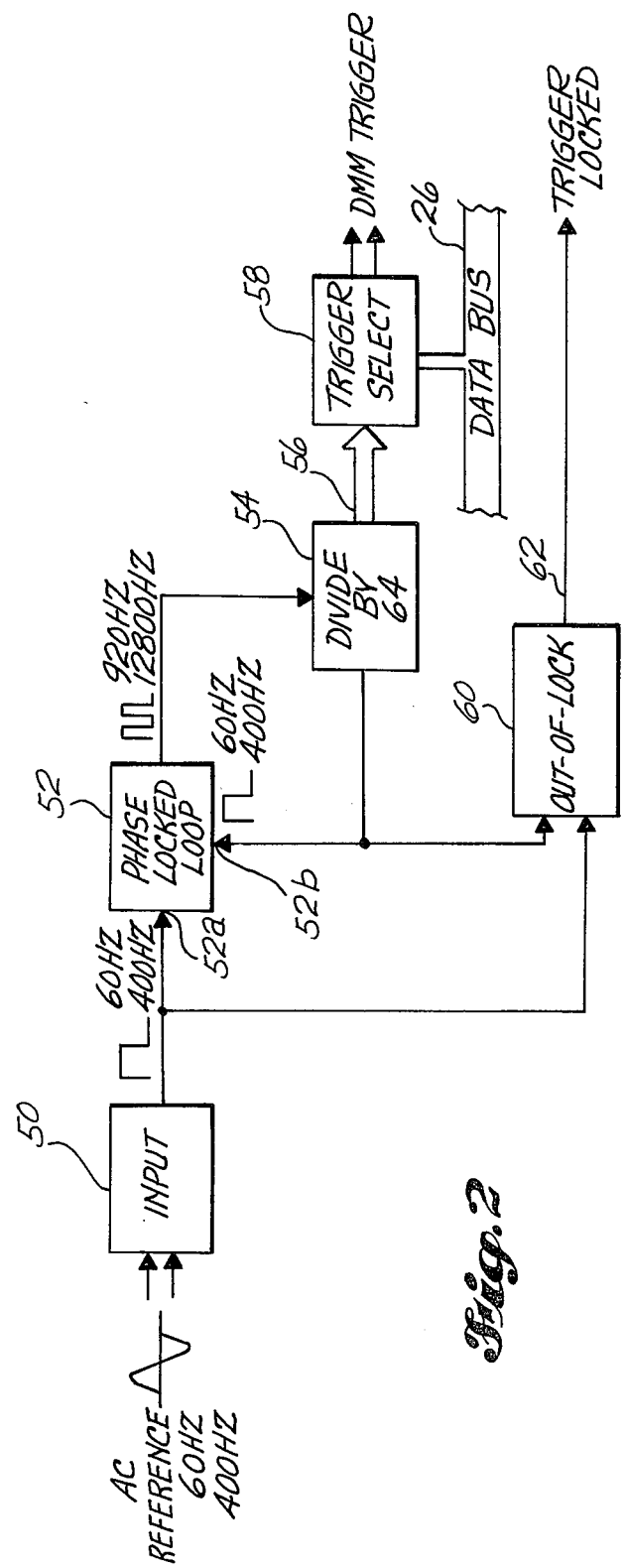
FIG. 2 is a detailed block diagram of the trigger circuit shown in FIG. 1.

FIG. 2 is a detailed block diagram of the trigger circuit 46.

An AC reference waveform which, in this the preferred embodiment of the invention, may be either 60 Hz or 400 Hz as supplied by the aircraft under test, is routed from the relay module 12 to the input of an input circuit 50. Input circuit 50 includes a conventional sine to squarewave converter which converts the AC reference signal to a corresponding squarewave signal.

The squarewave from input circuit 50 is routed to a first input 52a of a phase-locked loop 52. The function of the phase-locked loop circuit 52 is to synchronize itself to the squarewave from the input circuit and thus be synchronized to the AC reference signal. The ouput from the phase-locked loop 52, which is designed to run between 920 Hz and 12,800 Hz, is applied to the input of a divide by 64 circuit 54. Divide by 64 circuit 54 produces an output signal having a frequency of between 60 Hz to 400 Hz which is fed to the second input 52b of phase-locked loop 52. In the well-known manner, phase-locked loop 52 responds to signals at its inputs 52a, 52b to cause its ouput signal to phase-lock with the signal applied at its input 52a.

The divide by 64 circuit 54 has a six bit output line 56 which provides all of the logic signals that partition the reference signal and provide the digital multimeter trigger signals at specific points in relation to the reference, i.e. zero crosses, positive peaks, and trigger bursts required for signal sampling, as will be more fully understood with respect to the discussion hereafter.

A trigger select circuit 58 operates to select one of eight possible trigger formats provided on the data bus 26 under microprocessor control and provides the drive capability necessary to trigger the sample/hold analog to digital circuit of the digital multimeter. Thus, the microprocessor, by applying an appropriate signal on the data bus 26, selects the desired trigger signal from those available on the line 56. Preferably, a one shot multivibrator is provided within trigger select circuit 58. The one shot is configured to trigger on either the leading or falling edges of signals on the line 56 to thereby produce fixed time width trigger signals.

The eight possible trigger formats produced by the trigger select circuit are:

(1) Fast spurt—64 trigger pulses produced in the time frame of one cycle of the reference waveform with the pulses beginning at the positive going zero cross of the reference.

(2) Half-wave fast spurt—32 trigger pulses produced during the positive half cycle of the reference waveform with the pulses beginning at the positive going zero cross of the reference.

(3) Spurt—32 trigger pulses produced in the time frame of one cycle of the reference waveform with the pulses beginning at the positive going zero cross of the reference.

(4) Half wave spurt—16 trigger pulses produced during the positive half cycle of the reference waveform with the pulses beginning at the positive going zero cross of the reference.

(5) Quadrature—trigger pulses produced at the quadrature points of the reference waveform, i.e. zero degrees, 90 degrees, 180 degrees, 270 degrees and 360 degrees, with the pulses beginning at the positive going zero cross of the reference.

(6) Positive peaks—trigger pulses produced at the positive peaks of the reference waveform.

(7) Negative peaks—trigger pulses produced at the negative peaks of the reference waveform.

(8) Zero crosses—trigger pulses produced at the positive and negative going zero crosses of the reference waveform.

Also provided in the trigger circuit is an out-of-lock circuit 60. The function of out-of-lock circuit 60 is to indicate those instances in which the output of the phase-locked loop is not locked to the reference signal. This indication is by a one shot multivibrator provided within out-of-lock circuit 60 which, when triggered, causes an out-of-lock signal to be coupled to the microprocessor via a line 62. The microprocessor responds to an out-of-lock signal on line 62 to indicate a potential fault within the testing system.

Returning to FIG. 1, the purpose of relay module unit 12 is to provide the relay switching necessary to select any one of 360 test points for the HI and LO signal paths connected to the digital multimeter 14. The relay module unit also provides the relay switching circuitry to select one of eight possible trigger references as a phase reference for the trigger circuit 46 and one of seven ground references for use in voltage and resistance measurements made to ground.

In the relay module unit 12 there are two distinct signal paths to the relays. The signal path that is ultimately connected to the HI input side of the digital multimeter is designated the Y-signal path. That signal path which terminates at the LO input to the digital multimeter is designated the X-signal path. Except for minor differences, the two signal paths are identical, parallel paths to each of the 360 test points.

Figure 3:
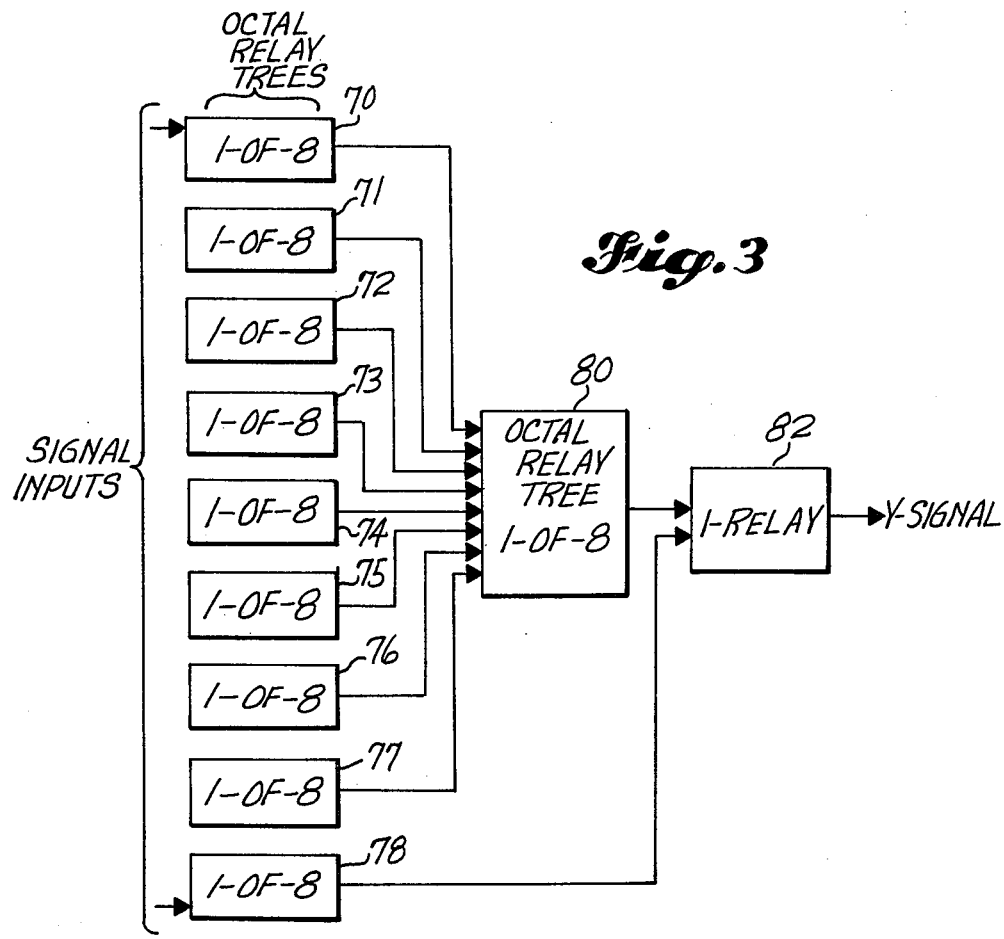
FIGS. 3 and 4 are detailed block diagrams of the relay module unit shown in FIG. 1.

In this, the preferred embodiment of the invention, the 360 test points of the unit under test 18 are connected to the relay module 12 via five plugs. FIG. 3 shows a block diagram of the Y-signal path for one plug. It should be understood that there are analogous paths for both the X and Y sides for each of the five plugs.

The inputs to the Y signal path provided at plug 1 come from 67 pins within this plug. Thus, the Y-signal output from the circuitry of FIG. 3 is one of 67 possible inputs depending upon the condition of the intervening relays.

Thus, these 67 possible signal inputs are connected to nine one-of-eight octal relay tree blocks 70–78. An appropriate one of the relays within block 70–78 will be actuated when a corresponding signal input is desired at the Y-signal output.

The first eight one-of-eight octal relay trees 70–77 are connected to the eight inputs of the octal relay tree one-of-eight block 80. One-of-eight octal relay tree 80 selects that one of its inputs which is desired as an output Y-signal. Should the desired Y-signal appear on the one-of-eight octal relay tree block 78, it is appropriately selected over the output from one-of-eight octal relay tree 80 by an additional relay 82.

Thus, the basic relay tree of FIG. 3 is repeated for the Y-signal until relay switching allows selection of any one of the 360 possible test inputs. Correspondingly, the X-signal path also has the independent capability of selecting as its X-signal any one of the 360 test points.

Figure 4:
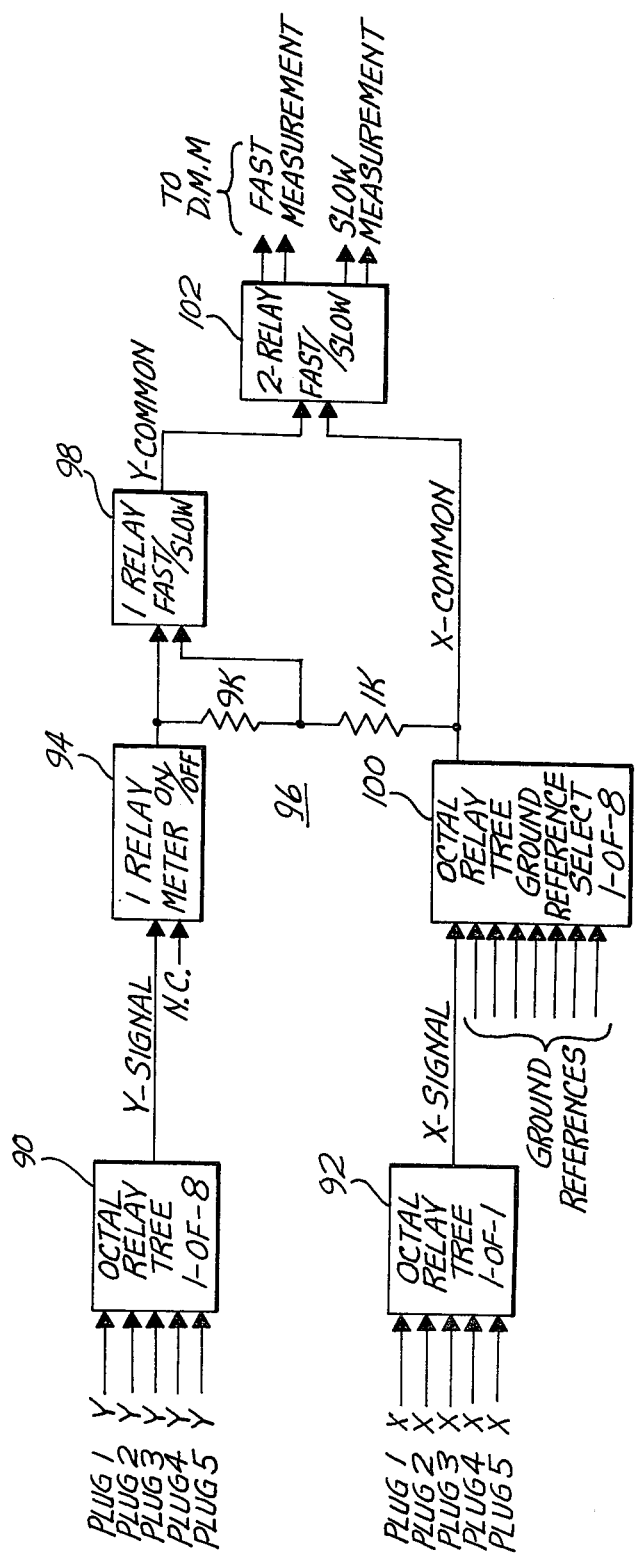

FIG. 4 illustrates that portion of the relay module 12 of FIG. 1 which processes the outputs from the various plugs, one of which is shown in FIG. 3. Thus, the five Y channel plugs connect to an octal relay tree one-of-eight 90 and the five X channel plugs connect to the octal relay tree one-of-eight 92. Each octal relay tree 90, 92 selects that one of the plug outputs which has been selected as the Y or X signal.

Up to this point, the X and Y signal paths have been identical, parallel paths through the relays. From here, however, the Y-signal path goes to a meter on/off relay 94 which serves the function of applying or removing the Y-signal from the inputs to the digital multimeter. The meter on/off relay 94 is also used to open circuit the connection between the Y-signal and X-signal paths when either or both is switched to some logically non-adjacent pins, i.e. when more than one relay is switched in the X-signal path or Y-signal path. This prevents the possibility of applying any extraneous signals to the circuits of the airplane under test as a result of a race condition as the relays in the signal paths switch.

After the Y-signal leaves the meter on/off relay, it is applied to the HI side of a resistive divide by 10 network, indicated generally at 96, and to a fast/slow relay 98. The divide by 10 network 96 attenuates the Y-signal by a factor of 10 with the fast/slow relay 98 selecting the Y-signal or the Y-signal divided by 10 signal. The output from the fast/slow relay 98 is designated Y-common.

The X-signal selected by the relay tree 92 is routed as one input of an octal relay tree 100. Octal relay tree 100 serves as the ground reference selection circuitry. Thus, when pin to pin measurements are desired, the X-signal is selected as the output of the ground reference selection circuitry and is applied to the LO side of the resistive divide by 10 network 96. Otherwise, one of seven other ground references can be selected by the octal relay tree 100. The output from the octal relay tree 100 is designated as the X-common signal.

The final step in the signal selection process is a set of two fast/slow relays within block 102. The relays 102 switch the X-common and Y-common signals to the lines that go to the analog to digital converter input of the digital multimeter for fast mode measurements or to the analog voltage input of the digital multimeter for slow mode measurements. Fast mode and slow mode measurements are discussed more fully hereafter. To accomplish the required relay switching in the signal selection process the microprocessor (14 of FIG. 1) keeps track of and controls 22 relay data bits. These data bits affect the following areas:

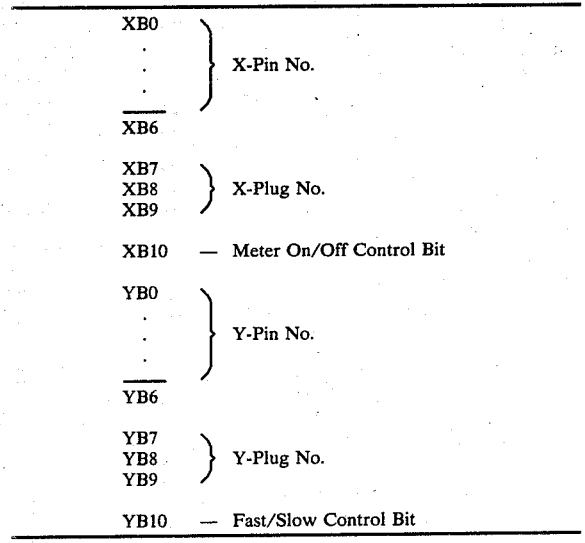

These data bits are used to drive optoisolators (not shown) which in turn are used to short to ground the LO side of the relay coils being addressed.

Data bits 7, 8 and 9 are used to selectively apply DC voltage to only those relay trees being addressed. Within each relay tree is a positive interlock system (discussed with reference to FIG. 12) which feeds the DC bias voltage forward to only those relays necessary to complete the desired signal path. This system of selectively applying power to the relays eliminates redundant switching of signal relays and greatly increases the overall life span of the relay module unit.

Figure 5:
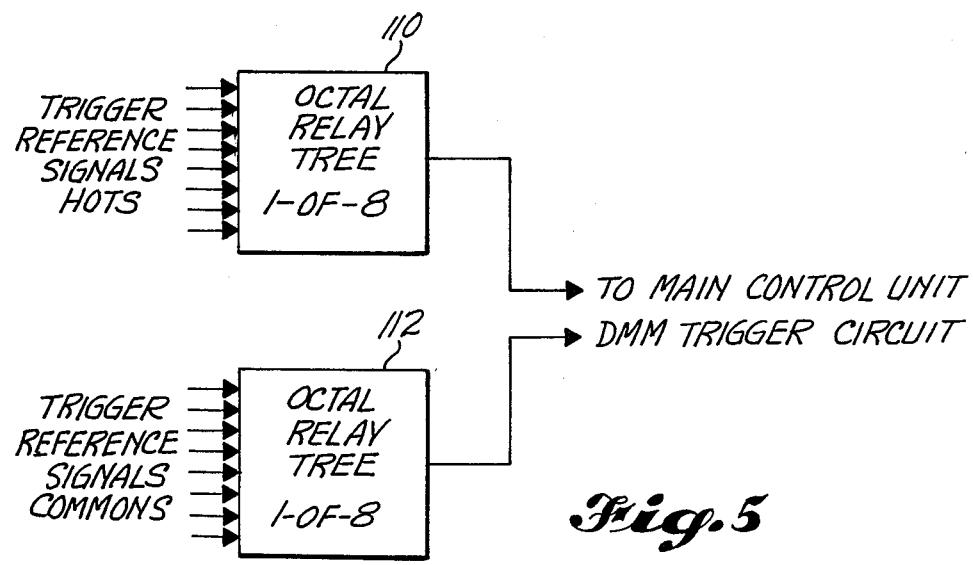
FIG. 5 is a block diagram of the trigger reference selection circuitry.

FIG. 5 depicts the trigger reference selection circuitry of the relay module unit 12 (FIG. 1). The purpose of this tree is to select one of eight possible AC signals and pass the selected signal to the digital multimeter trigger circuit (FIG. 2) in the main control unit.

The trigger reference selection circuitry is comprised of two binary coded octal relay trees 110, 112 which are arranged so that one of the trees selects the "hot" side of the desired trigger reference and the other tree selects the corresponding common side. Trigger reference selection is accomplished under microprocessor software control.

Referring once again to FIG. 1, the digital multimeter 14 functions to provide an externally triggerable sample/hold analog to digital circuit for obtaining fast digitized voltage samples of the waveform being tested and to provide highly accurate independent measurements of DC volts, AC volts, true RMS volts (TRMS) and resistance when required to substantiate the measurement values calculated from the high speed data by the test system.

The preferred embodiment of the invention employs a Racal-Dana model 6000 digital multimeter, which is described in detail in Racal-Dana publications 980513—Operators Manual and 980514—Maintenance Manual.

Finally, the data terminal 16 of FIG. 1 provides a means to record all test measurements, and tolerance parameters performed on a unit under test by the automatic test system. Whereas the preferred embodiment of the invention allows any data terminal compatible with RS-232 protocol to be used, a Texas Instruments Silent 700 has been employed in the preferred embodiment.

Figure 6:
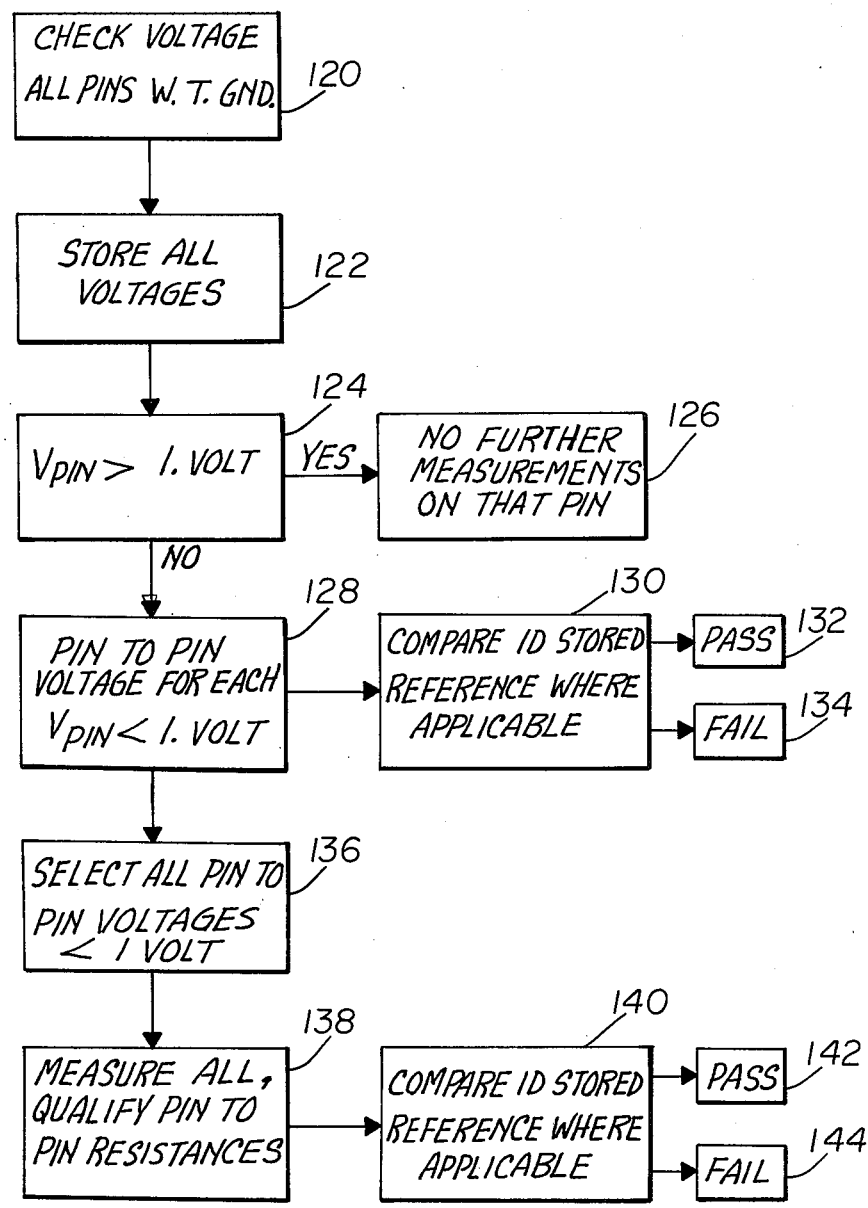
FIG. 6 is a flow diagram which depicts the overall test procedure practiced by the test system.

FIG. 6 is a logic flow diagram depicting the overall system procedure used to check out a device under test.

First, the voltage on each pin, or test node, to be checked is monitored as indicated by block 120. As is discussed more fully hereafter, this system has the capability of testing for AC, DC, AC on DC, digital or noise signals. The particular voltage level monitored is compared against a stored reference and an appropriate indication made if the siqnal is out of its tolerance value. As indicated by block 122, the test voltages at all pins are stored. At block 124, the voltage stored at each pin is compared against a reference level, here one volt. If a pin voltage exceeds one volt, no further measurements are made on that pin as indicated in block 126. However, for those pins having a pin to ground voltage less than one volt, the system then measures all pin to pin voltages at block 128. Where a reference pin to pin voltage has been stored for the pins under test, a comparison with the stored tolerance value is made at block 130. Thereafter, either a pass, block 132, or a fail, block 134, indication is made.

In addition, at block 136 those pins having pin to pin voltages less than one volt are selected such that pin to pin resistance can be measured, block 138. The resulting measurements may be compared with stored tolerance values, block 140, and an appropriate pass, block 142, or fail, block 144, indication given.

It should be understood that the logic flow expressed in FIG. 6 is a result of appropriate programming in the microprocessor 38 of FIG. 1. For the purpose of making the present discussion concise, a complete computer program is not given for the flow diagram of FIG. 6, or for any of the other logic flow diagrams discussed herein. However, with the present discussion in hand, it would be quite easy for one of ordinary skill in this art to construct an operative system.

Figure 7:
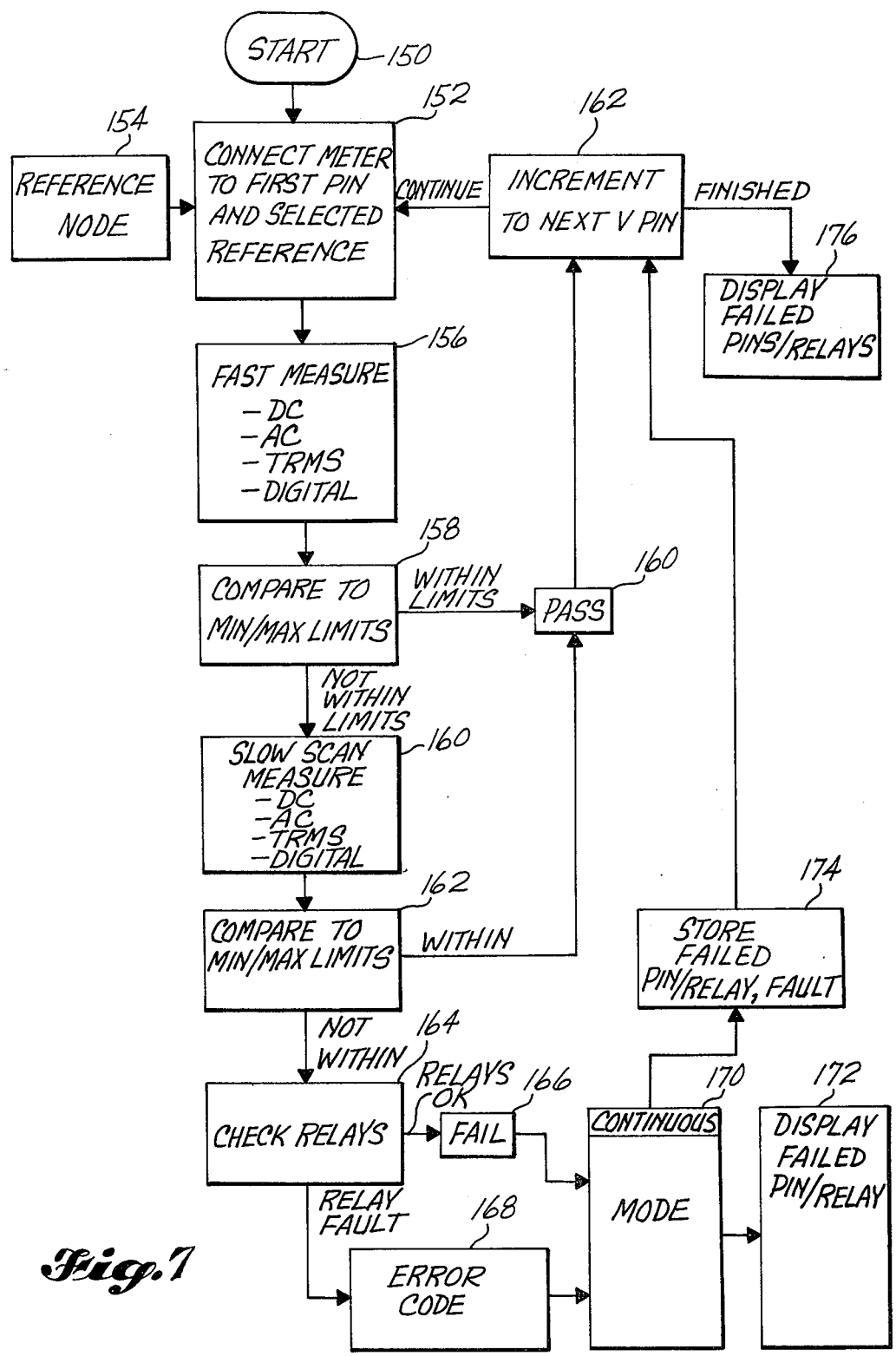
FIG. 7 is a detailed flow diagram illustrating the fast measure, slow measure and relay check procedure practiced by the test system.

FIG. 7 is a more detailed logic flow diagram illustrating the procedure by which the present invention checks test node voltage levels using both fast and slow measurement techniques, as well as the manner by which the present system runs a self test.

Operation begins at the start, block 150. Here, all systems are initialized at predetermined levels. Then, at block 152 the meter is connected between the first pin, or test node, to be checked and a selected reference. Normally, the selected reference is ground potential but, as is discussed with reference to FIG. 4, the reference node can be any one of several selected references, indicated by block 154.

At this point, the system is in a fast measurement mode, as indicated by block 156. In this mode, both spurt and quadrature mode samples (to be discussed later herein) are taken at high speed of the voltage at the pin under test. The system includes a means (discussed hereafter) to determine whether the signal at the pin is DC, AC, AC on DC, digital or noise. The true RMS value of the signal being tested is measured and stored. The resultant voltage level is compared with tolerance limits (i.e. min/max limits) at block 158. If the voltage at the pin under test is within the tolerance limits, this pin passes the test, block 160, and the system increments to measure the voltage at the next pin to be tested, block 162.

If the voltage being measured at the pin under test is not within the prescribed limits, the system enters a slow measure mode, block 160. In this mode, the pin being tested is directly connected to the digital multimeter to obtain a slow speed reading. Again, at block 162, the slow speed reading is compared to tolerance min/max limits. If the voltage is now found to be within desired limits, the pin voltage passes, block 160, and the system increments to the next pin, block 162.

If, however, the slow test indicates that the voltage at the pin under test is not within acceptable limits, the system checks its own relays, block 164.

Relay checkout is performed as follows. Assume, for example, that the X relay tree was connected to test point B and an out-of-tolerance condition identified upon the Y relay tree being connected to test point A, i.e. the digital multimeter is measuring a point A to point B parameter. The system then causes both the X and Y relay trees to be connected to test point B. In its resistance measuring mode, the multimeter detects either a low resistance, indicative of a solid electrical path through both relay trees, or a high resistance, reflecting at least one open relay contact set. Both the X and Y relay trees are then connected to test point A and the contact resistance test performed. Then, relay tree Y is connected to test point B and relay tree X is connected to test point A. The parameter being measured is compared to a stored value. Finally, the above contact resistance procedure repeats with the test points A and B reversed.

In this manner, the system identifies both random and "hard" relay failures. With the results of the above diagnostic tests stored in memory, the system can aid a technician in locating and correcting relay malfunctions.

Now, if the system is in the normal mode, block 170, all further testing is stopped and a display is made to the operator as to the failed pin or failed relay, block 172.

If, however, the system is in the continuous mode, the pertinent information concerning the failed pin under test or relay is stored, block 174, and the system increments to the next pin under test.

This procedure continues until all of the test nodes have been checked, at which time the system is finished and a comprehensive display of the failed pins and/or relays can be made, block 176.

Figure 8:
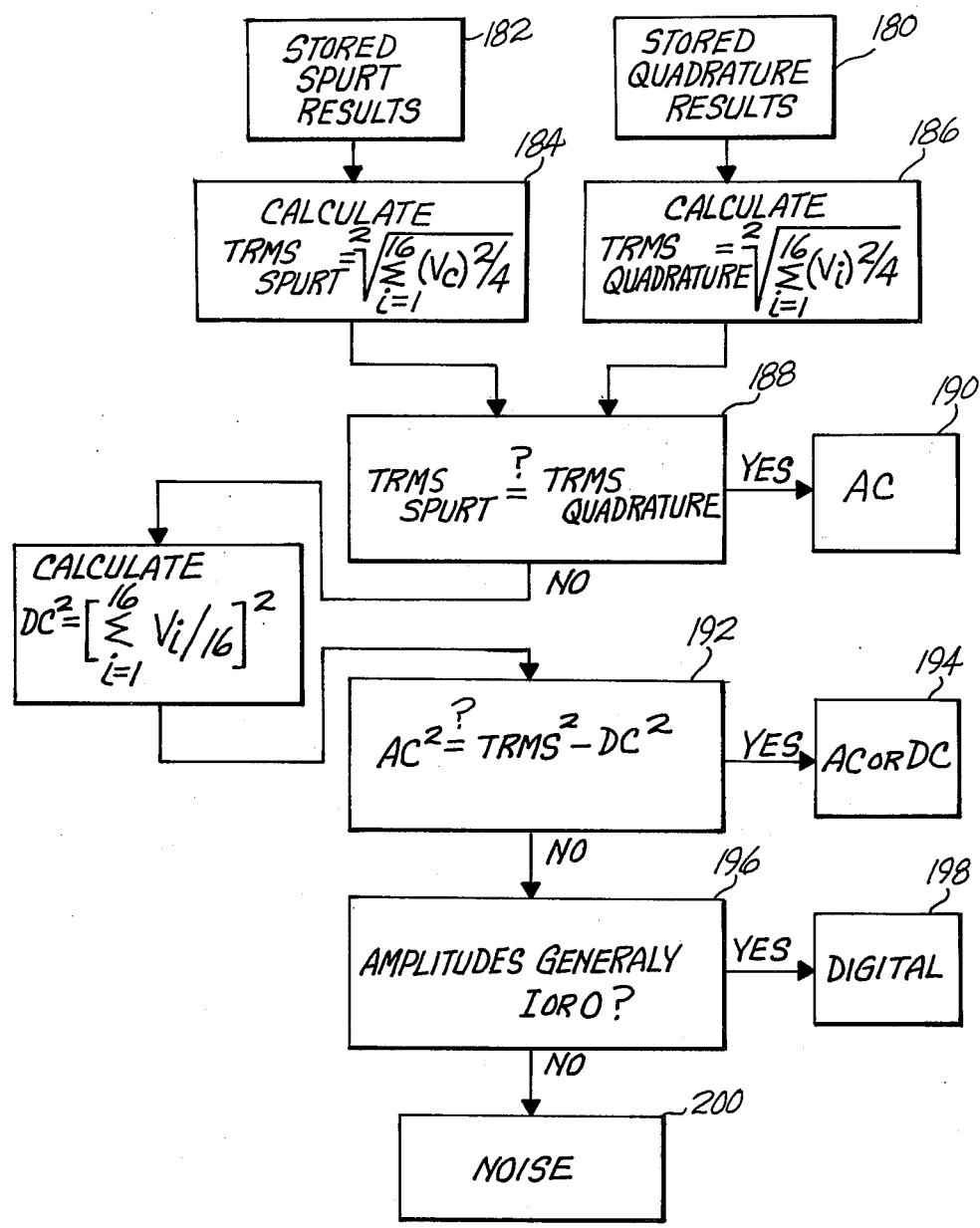
FIG. 8 is a logic flow diagram illustrating the process by which the circuit testing system determines the nature of the voltage on a pin when in its fast measurement mode.

FIG. 8 is a logic flow diagram illustrating the process by which the circuit testing system determines the nature of the voltage on a pin when in its fast measurement mode. When the system is connected to a pin under test, both spurt and quadrature sampling is done. These two types of sampling are better understood with reference to FIG. 9. In this, the preferred embodiment of the invention, quadrature sampling is sampling of the signal at the pin under test at each 90 degree point of a reference waveform, here 400 Hz. A total of 16 samples are taken over a period of four cycles of the waveform. Thus, the stored quadrature results are represented by block 180.

Also taken are a series of spurt samples. Here, again referring to FIG. 9, the spurt samples are 16 samples taken over one-half of one wavelength of the reference 400 Hz signal. The results of the spurt sampling are stored, block 182.

The system then calculates true RMS values for the waveform samples both for the spurt, block 184, and for the quadrature, block 186, stored samples. A test is then made, block 188, to determine whether or not the calculated true RMS spurt value equals the calculated true RMS quadrature value. If equality does exist, the system then identifies the signal at the pin under test as being AC, block 190.

If the equality does not exist, the system makes a calculation to determine whether or not the AC value at the pin, when squared, is equal to the true RMS value of the pin voltage squared minus the pin DC voltage squared, this at pin block 192. If the equality is satisfied, the system identifies the voltage at the pin under test as being AC on DC, block 194.

If the equality is not satisfied, the system determines whether or not the voltage levels at the pin are generally at a logic HI or LO, i.e. one or zero, level, at block 196. If they are, the voltage at the pin under test is identified as being digital, block 198. If they are not, the system indicates that the signal at the pin under test is noise, block 200.

Thus, by following the process shown in FIG. 8, the present system can, in the course of making fast measurements of the voltage at various test nodes, quickly determine the nature and level of the pin voltage being tested.

Figure 9:
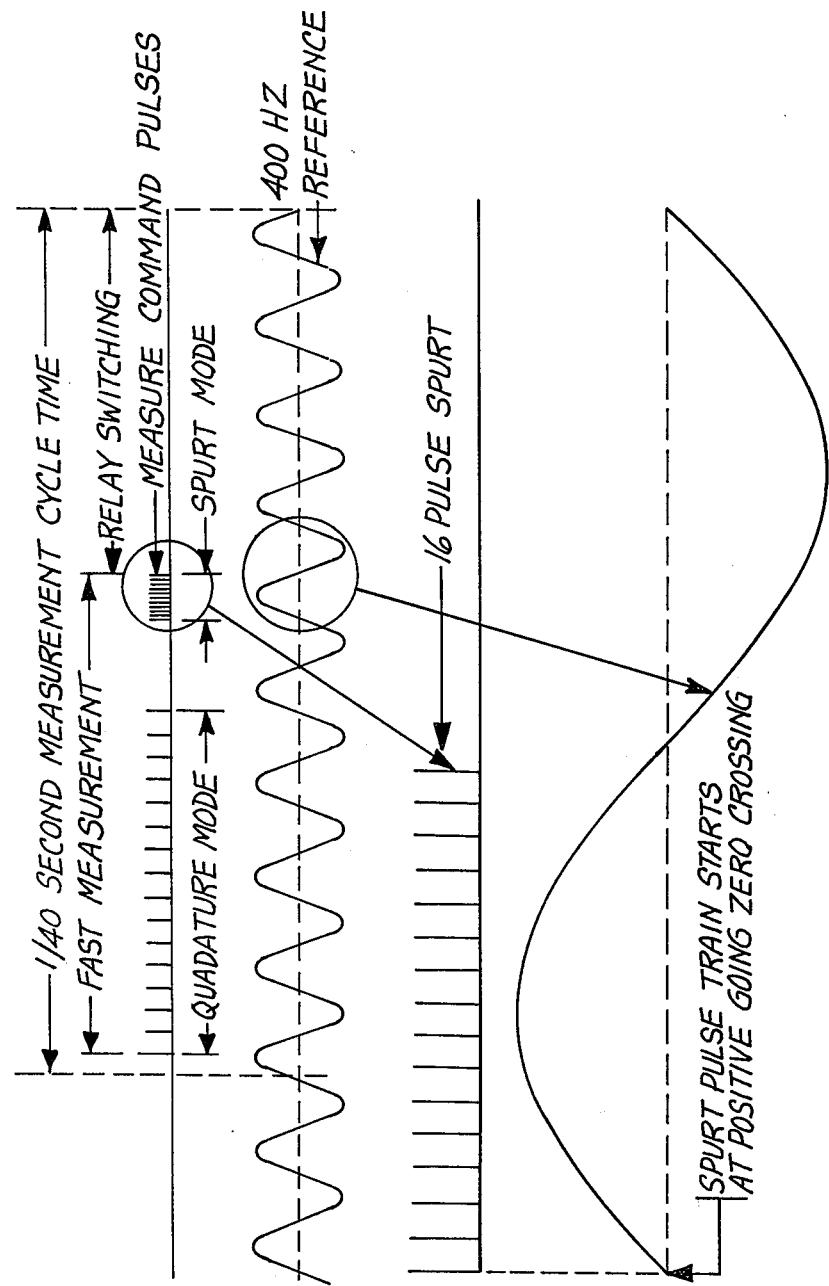
FIGS. 9 and 10A, 10B illustrate the signal sampling techniques practiced by the test system.

FIG. 9, as is discussed hereinabove with respect to FIG. 8, indicates the manner by which spurt and quadrature mode samples are taken of a pin under test.

Figure 10A:
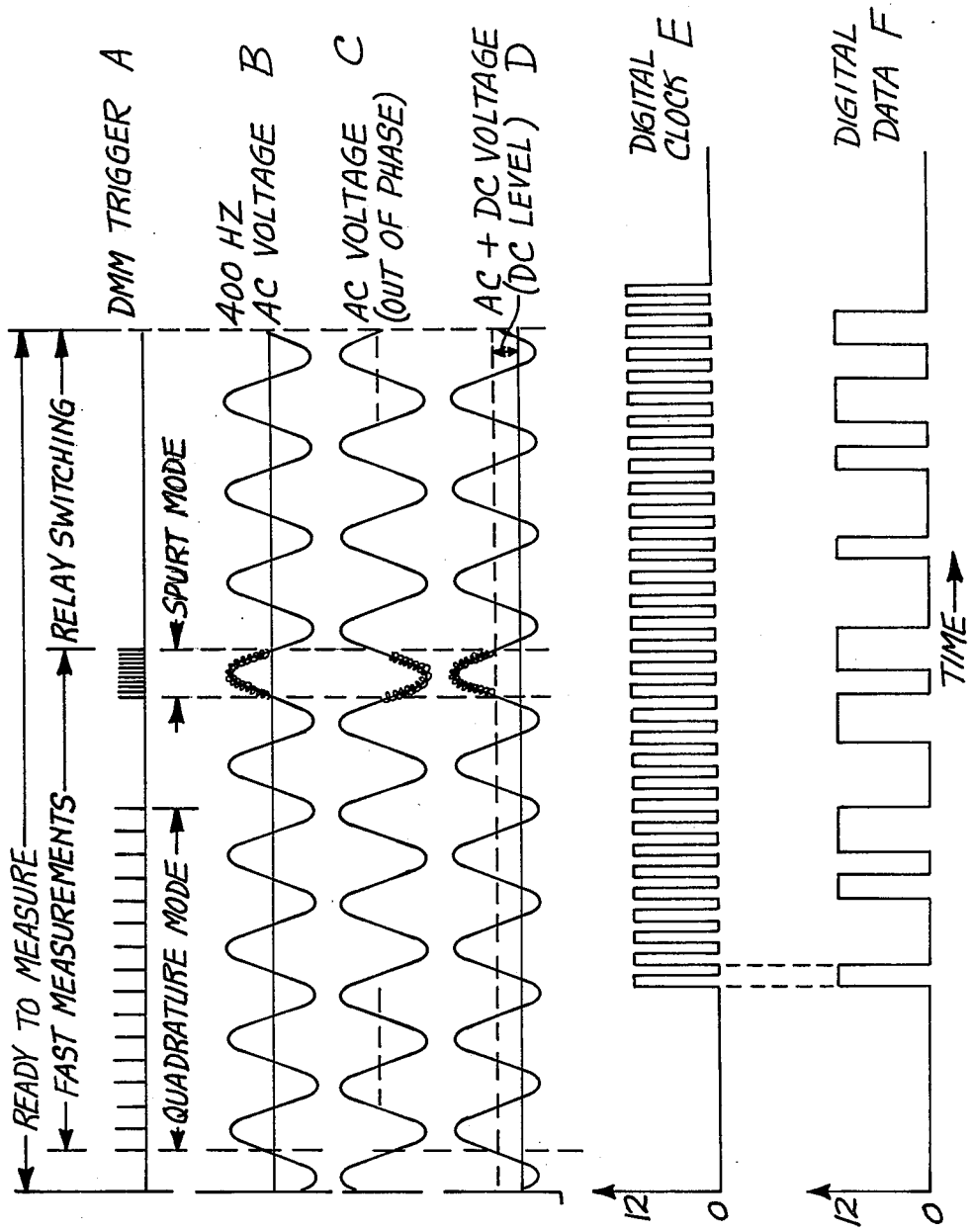
Figure 10B:
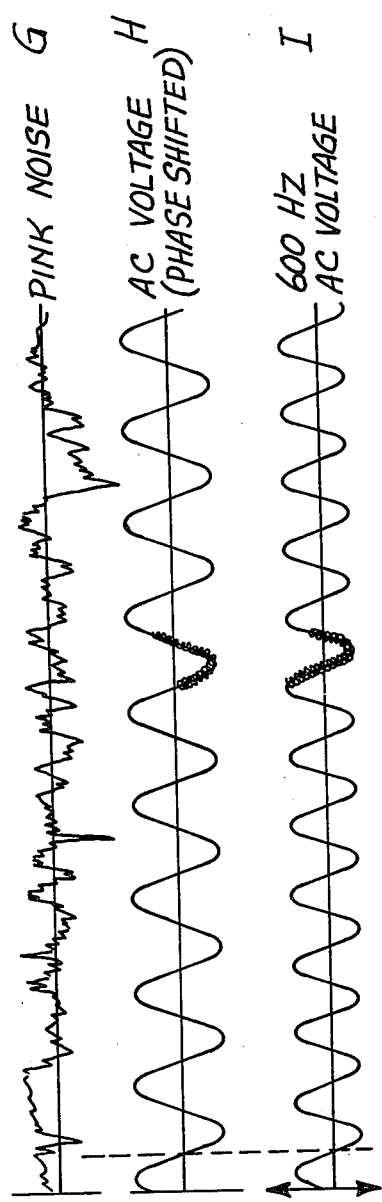

FIGS. 10A, 10B further illustrate signal waveforms which may be present in the present circuit testing system.

Thus, line A indicates those points at which the digital multimeter is triggered to take samples of the voltage at the pin under test. The triggering takes place with respect to a reference waveform—here, a 400 Hz AC voltage which is normally provided in the aircraft under test.

For the example of the waveform shown in line B, the signal under test is also 400 Hz and is in phase with the reference voltage. Thus, the sample points taken are the peak to peak voltages appearing on the waveform under test in the quadrature mode, whereas the samples taken during the spurt mode are one-half of the positive half cycle of the sine wave. By appropriate signal processing, then, the system can determine that an in phase, 400 Hz AC voltage is present and the true RMS value of the wave can be calculated.

Line C indicates the condition wherein the voltage at the pin under test is an AC, 400 Hz voltage which is out of phase with the reference waveform. Now, quadrature mode samples are seen to be at the zero crossing point of the waveform, with an average value of zero as with the waveform of line B, thereby indicating the absence of a DC signal. However, the spurt mode samples are now over the negative half of the waveform, thereby indicating the out of phase condition.

Line D indicates a sampled signal which includes an AC, in phase signal riding on a fixed DC level. Now, it will be noted that the average of the quadrature signals is no longer equal to zero but, in fact, equals the DC level. The spurt samples indicate that the waveform has an AC component which is in phase with the reference waveform.

The waveforms at lines E and F represent digital information, namely a digital clock and digital data, respectively. The samples of either waveform generally assume either a high (here 12 volts) or a low (here zero volts) state. Thus, by appropriate processing the circuit testing system can determine the presence of a digital signal on a pin under test.

If, in a manner described with respect to FIG. 8, the system determines that the signal at the pin under test is not AC, DC, AC on DC or digital, it is assumed to be noise, as indicated on line G. Thus, the samples take on a random nature.

Lines H and I indicate two other types of waveforms which the system may encounter. Line H represents a 400 Hz AC voltage which has been phase shifted with respect to the reference waveform. By appropriate processing, the present system can determine that the signal is an AC voltage having the same frequency as the reference and can further determine the degree of phase shift. Line I represents a 600 Hz signal and illustrates the quadrature and spurt samples taken thereon. By appropriate signal processing, the frequency of this waveform may be determined.

It should be noted that whereas the specific process for identifying the waveforms of line H and I is not shown herein, such processes are well known to those of ordinary skill in this art.

FIG. 11 is a block diagram illustrating the manner by which the present invention reduces the wear on the relays in the switching tree.

Here, a total of K connections are shown made from the switching tree 210 to the unit under test 212. The switching tree, in response to its X address and Y address lines from the address line drivers 214 causes a selected pair of unit under test connection points to be connected to the HI and LO terminals of a digital multimeter 216.

As discussed previously, the relays within the switching tree are arranged in binary fanout with the last eight fanout lines of each octal digit connected for Grey coded octal digits. Thus, power interlock lines 218, which, as with the address line drivers 214, are under the control of the microprocessor 220, couple X and Y interlock lines to the switching tree 210. The X and Y interlock lines inhibit unnecessary switching in the octal sets of relays. Thus, each octal tree is caused to be operated an equal number of times in a full switching scan of the K connections to the unit under test regardless of the numerical significance of the octal digit. The advantage in this arrangement lies in the fact that with a simple binary tree of relays, the least significant bit position relays would otherwise be operated many more times than they are under the interlock control.

For example, assuming that K=360, the least significant bit position relays of the switching tree would be operated 64,800 times in a single X-Y scan (all possible combinations of points taken two at a time). With the use of the power interlock circuitry, a full X-Y scan of 360 points would only require 720 operations of the least significant bit position relays. This feature not only saves power requirements, but considerably extends the expected life of the relays.

In summary, an automatic circuit testing system has been disclosed which is capable of high speed testing operation and yet provides a highly reliable indication of whether or not a test ooint voltage exceeds its tolerance value.

While a preferred embodiment of the invention has been described in detail, it should be apparent that many modifications and variations thereto are possible, all of which fall within the true spirit and scope of the invention.

I claim:

1. Apparatus for automatically testing an electrical circuit having a plurality of test nodes, the apparatus comprising:

metering means for measuring the electrical characteristics of circuit nodes connected thereto, said metering means being operable in a fast mode for taking high speed samples of a signal on a circuit node connected thereto, and being operable in a slow mode for measuring the analog value of a signal on a circuit node connected thereto;

switching means being actuable to connect selected circuit test nodes to said metering means;

control means coupled to said metering means and said switching means and being operable for:

(a) actuating said switching means such that a selected circuit test node is connected to said metering means;

(b) operating said metering means in said fast mode for taking high speed samples of the signal at said connected node;

(c) predeterminedly processing said high speed samples;

(d) comparing said processed high speed samples with a predetermined first tolerance value;

(e) operating said metering means in said slow mode for measuring the analog value of the signal at said connected node in response to said processed high speed samples being outside said first tolerance value;

(f) comparing said slow speed measured analog value with a predetermined second tolerance value; and (g) indicating a fault condition in response to said slow speed measured analog value being outside of said second tolerance value.

2. The apparatus of claim 1 wherein said control means further includes means for:

testing the operability of at least a portion of said automatic testing apparatus in response to said slow speed measured analog value being outside of said predetermined second tolerance value; and indicating a fault of said automatic testing apparatus in response to said tested portion being inoperable.

3. The apparatus of either one of claims 1 or 2 wherein said control means includes means in the performance of step (b) for:

generating trigger pulses synchronized to a reference periodic waveform;

operating said metering means to quadrature sample, in response to said trigger pulses, the signal at said connected node for a predetermined number of quarter wave intervals of said periodic waveform; and operating said metering means to spurt sample, in response to said trigger pulses, the signal at said connected node by taking a predetermined number of samples over at least one quarter wave of said periodic waveform.

4. The apparatus of claim 3 wherein said control means includes means in the performance of step (c) for:

storing the quadrature and spurt samples; and calculating the true RMS (TRMS) value of the sampled signal from the equations:

$$TRMS_{spurt} = \sqrt[2]{\sum_{i=1}^{N_s} (V_i)^2/4}$$

where $N_s$ is the total number of spurt samples taken, and $V_i$ is the value of the ith sample, and $$TRMS_{quadrature} = \sqrt[2]{\sum_{i=1}^{N_q} (V_i)^2/4}$$

where $N_q$ is the total number of quadrature samples taken, and $V_i$ is the value of the ith sample.

5. The apparatus of claim 4 wherein the control means further includes means in the performance of step (c) for:

recognizing the sampled signal as being AC if $TRMS_{quadrature} = TRMS_{spurt}$;

recognizing the sampled signal as being AC on DC if;

(a) $TRMS_{quadrature} \neq TRMS_{spurt}$, and (b) $AC^2 = TRMS^2_{quadrature} - DC^2$, where AC is the AC portion of the sampled signal and DC is the DC portion of the sampled signal;

recognizing the sampled signal as being digital if the spurt and quadrature samples tend to assume only logic 0 and 1 level states; and recognizing the sampled signal as being noise if it is not AC, AC on DC or digital.

6. The apparatus of claim 1 wherein:

said metering means is operable to measure the resistance between test nodes connected thereto; and said control means is operable to actuate said switching means such that said metering means measures the node to node resistance of selected ones of said test nodes.

7. The apparatus of claim 6 wherein said control means futher comprises:

first means for identifying those test nodes having a measured analog signal level thereon which is less than a predetermined reference level;

second means for identifying those test node pairs which have a measured analog signal level of one node with respect to the other of less than a predetermined reference level; and means for actuating said switching means and said metering means for measuring the resistance between only those data nodes identified by said first and second means.

8. The apparatus of claim 1 wherein the switching means comprises:

a plurality of relays arranged in a binary switching tree;

and wherein said control means includes means for predeterminedly actuating said relays by Grey coded octal digit signals to thereby reduce the number of relay actuations necessary to form all possible connections through said switching tree.

9. A method for automatically testing an electrical circuit having a plurality of test nodes, the method comprising the steps of:

providing metering means for measuring the electrical characteristics of circuit nodes connected thereto, said metering means being operable in a fast mode for taking high speed samples of a signal on a circuit node connected thereto, and being operable in a slow mode for measuring the analog value of a signal on a circuit node connected thereto;

providing switching means for selectively connecting predetermined test nodes to said metering means; and providing control means coupled to said metering means and said switching means and performing the steps of:

(a) actuating said switching means such that a selected circuit test node is connected to said metering means;

(b) operating said metering means in said fast mode for taking high speed samples of the signal at said connected node;

(c) predeterminedly processing said high speed samples;

(d) comparing said processed high speed samples with a predetermined first tolerance value;

(e) operating said metering means in said slow mode for measuring the analog value of the signal at said connected node in response to said processed high speed samples being outside said first tolerance value;

(f) comparing said slow speed measured analog value with a predetermined second tolerance value; and (g) indicating a fault condition in response to said slow speed measured analog value being outside of said second tolerance value.

10. The method of claim 9 wherein said control means performs the further steps of:

testing the operability of at least a portion of said switching means in response to said slow speed measured analog sample being outside of said predetermined second tolerance value; and indicating a fault of said switching means in response to said tested portion thereof being inoperable.

11. The method of either one of claims 9 or 10 wherein step (b) includes the further steps of:
(i) generating trigger pulses sychronized to a reference periodic waveform;
(ii) operating said metering means to quadrature sample, in response to said trigger pulses, the signal at said connected node for a predetermined number of quarter wave intervals of said periodic waveform; and
(iii) operating said metering means to spurt sample, in response to said trigger pulses, the signal at said connected node by taking a predetermined number of samples over at least one quarter wave of said periodic waveform.

12. The method of claim 11 wherein step (c) includes the further steps of:
(i) storing the quadrature and spurt samples; and
(ii) calculating the true RMS (TRMS) value of the sampled signal from the equations:

$$TRMS_{spurt} = \sqrt[2]{\sum_{i=1}^{N_s} (V_i)^2/4}$$

where $N_s$ is the total number of spurt samples taken, and $V_i$ is the value of the ith sample, and $$TRMS_{quadrature} = \sqrt[2]{\sum_{i=1}^{N_q} (V_i)^2/4}$$

where $N_q$ is the total number of quadrature samples taken and $V_i$ is the value of the ith sample.

13. The method of claim 12 wherein step (c) includes the further steps of:

recognizing the sampled signal as being AC if $TRMS_{quadrature} \simeq TRMS_{spurt}$;

recognizing the sampled signal as being AC on DC if:
(a) $TRMS_{quadrature} \neq TRMS_{spurt}$, and
(b) $AC^2 = TRMS^2 - DC^2$, where AC is the AC portion of the sampled signal and DC is the DC portion of the sampled signal;

recognizing the sampled signal as being digital if the spurt and quadrature samples tend to assume only logic 0 and 1 states; and recognizing the sampled signal to be noise if it is not AC, AC on DC or digital.

14. The method of claim 9 including the further steps of:

providing said metering means operable to measure the resistance between test nodes connected thereto; and said control means actuates said switching means such that said metering means measures the node to node resistance of selected ones of said test nodes.

15. The method of claim 14 wherein said control means performs the further steps of:

identifying those test nodes having a measured analog signal level thereon which is less than a predetermined reference level;

identifying those test node pairs which have a measured analog signal level of one node with respect to the other of less than a predetermined reference level; and actuating said switching means and said metering means for measuring the resistance between only those identified test nodes.

16. The method of claim 9 wherein the step of providing a plurality of switching means includes the step of providing a plurality of relays arranged in a binary switching tree;

and wherein said control means performs the further step of actuating said relays by Grey coded octal digit signals to thereby reduce the number of relay actuations necessary to form all possible connections through said switching tree.

* * * * *